United States Patent [19]
Kuddes

[11] Patent Number: 5,418,920
[45] Date of Patent: May 23, 1995

[54] REFRESH CONTROL METHOD AND SYSTEM INCLUDING REQUEST AND REFRESH COUNTERS AND PRIORITY ARBITRATION CIRCUITRY

[75] Inventor: David W. Kuddes, Richardson, Tex.

[73] Assignee: Alcatel Network Systems, Inc., Richardson, Tex.

[21] Appl. No.: 876,267

[22] Filed: Apr. 30, 1992

[51] Int. Cl.[6] .................... G06F 13/14; G06F 12/00; G11C 11/406
[52] U.S. Cl. .................... 395/425; 365/222; 364/DIG. 1; 395/325
[58] Field of Search .............. 395/425, 325; 365/189.07, 222, 189.07

[56] References Cited

U.S. PATENT DOCUMENTS

| | | | |
|---|---|---|---|
| 4,249,247 | 2/1981 | Patel | 395/425 |
| 4,965,722 | 10/1990 | Tokume | 395/425 |
| 5,184,325 | 2/1993 | Lipovski | 365/189.07 |
| 5,193,165 | 3/1993 | Eikill et al. | 395/425 |
| 5,317,709 | 5/1994 | Sugimoto | 395/425 |
| 5,347,491 | 9/1994 | Kagami | 365/222 |

Primary Examiner—Glenn Gossage
Assistant Examiner—Sheela N. Nodig
Attorney, Agent, or Firm—Vinson & Elkins

[57] ABSTRACT

A refresh control system and method for refreshing DRAM memory in a data processing system, such as a communications system, are disclosed. A timer increments a refresh request counter each time that a desired refresh interval elapses. The contents of the refresh request counter is compared with the contents of a burst refresh counter, and a bus request signal generated responsive to the contents differing from one another, such difference indicating that a refresh operation should be performed. The bus arbitration scheme assigns no higher priority to the refresh priority request than for other bus operations; at such time as bus access is granted to the refresh operation, burst refresh is performed until the contents of the burst refresh counter again match the refresh request counter, at which time the bus is released. An emergency high priority bus request is generated when the difference between the contents of the refresh request counter and the burst counter exceed a given limit, indicating that violation of the refresh specification is imminent.

14 Claims, 4 Drawing Sheets

REFRESH CONTROL METHOD AND SYSTEM INCLUDING REQUEST AND REFRESH COUNTERS AND PRIORITY ARBITRATION CIRCUITRY

This invention is in the field of data processing systems, and more particularly is directed to memory refresh control therein.

BACKGROUND OF THE INVENTION

Many modern data processing systems utilize dynamic random access memory (DRAM) integrated circuits for main solid-state data storage, due to the high density and low cost storage provided by this technology. These advantages of DRAM storage result from the use of single capacitor and a single access transistor as the DRAM storage cell. In contrast, conventional static random access memory (SRAM) storage cells are constructed as cross-coupled inverters with access transistors, generally requiring either six transistors, or alternatively four transistors and two resistors. As such, the silicon area required to fabricate a given number of DRAM cells, and thus the cost per bit of DRAM memory, is much smaller than that required for conventional SRAM integrated circuits. Accordingly, modern data processing systems and functions that require large memory capacity, for example millions of bytes, often use DRAM integrated circuits to implement such storage.

This construction of the basic DRAM storage cell requires that the contents of DRAM memory be periodically refreshed, to account for natural charge loss from the storage capacitors. Such refresh is conventionally effected by operating the DRAMso that sense amplifiers and restore circuitry within the DRAM sense the data state of a number of DRAM cells and restore the sensed state back into the cells. Conventional DRAMs have a refresh specification time period, on the order of milliseconds, within which each storage cell must be refreshed in order to guarantee retention of the stored contents.

As is well known in the art, refresh may be accomplished for a selected row of DRAM cells by the presentation of the corresponding row address in combination with a row address strobe (RAS) clock. Refresh according to this operation thus requires that the user store or otherwise monitor the addresses presented to the memory to ensure that all rows in the DRAMs are so accessed within the refresh specification period. In addition, many modern DRAMs operate according to a special cycle, in which a row of DRAM cells are selected according to the contents of an on-chip refresh address counter, and are refreshed in the special cycle; an example of such a special cycle is where the column address strobe (CAS_) is initiated prior to the row address strobe (RAS_), commonly referred to as CAS-before-RAS refresh. When using CAS-before-RAS cycles to refresh the DRAM, the user need not store or monitor the refresh addresses presented, but need only ensure that the proper number of such cycles are initiated within the refresh specification period.

In the system context, therefore, access to the DRAM memory must be periodically suspended in order to perform the necessary refresh. Conventional systems generally include timer circuitry which monitor the time since the most recent refresh operation, and initiate a refresh operation when necessary. Refresh may be accomplished in a distributed fashion, where a single refresh cycle is periodically performed, or in a burst fashion where many or all refresh cycles are performed less frequently than in distributed refresh. In either case, the DRAM memory is unavailable for a certain fraction of time, necessarily slowing system operation as a result. The relative efficiencies of distributed and burst refresh will depend upon the particular system context, and the urgency at which access to DRAM is required in normal system operation.

Many conventional data processing systems are constructed in such a manner that the DRAM memory and several data processing circuits are interconnected by way of a bus. In systems of this type, it is necessary that all unrelated bus traffic cease during such time as a refresh is being performed. The time required for DRAM refresh in these systems thus degrades system performance not only from a memory availability standpoint, but also because of the time that the bus is unavailable during DRAM refresh, precluding other non-memory access bus traffic during that time.

A particularly sensitive type of data processing system to refresh operations are those used in communications, such as local-area-network (LAN) controllers. In these systems, several data processing circuits, such as microprocessors, are connected to the bus and effect high speed data communication by transferring data among one another via the bus, for example by way of direct memory access (DMA). The bus traffic in such systems will generally be quite heavy; in addition, many messages may be quite long, occupying the bus for relatively long contiguous blocks of time.

As such, refresh is initiated in many bus architecture data processing systems by interrupting bus cycles that are in progress at such time as refresh is necessary, allowing the refresh operation to control the bus. Interruption of a bus cycle requires that the interrupted operation be restarted at such time as it can be granted access to the bus, thus requiring the operations of temporarily storing and later retrieving parameters necessary to restart the interrupted operation. Accordingly, DRAM refresh can cause significant system performance degradation, especially as the number of bus masters on the bus, and the bus traffic, each increase.

Another conventional method of effecting refresh in bus architecture systems is by way of "cycle stealing". According to this technique, the operation of the host microprocessor is monitored to determine when an operation is being performed that does not require the bus, such as an operation internal to the microprocessor. When such an operation is detected, a refresh is initiated and performed in parallel with the internal microprocessor operation, thus utilizing the memory and bus during those operations for which neither is being accessed.

In recent years, however, significant advances have been made to reduce the cycle time required for an internal microprocessor operation. Very short cycle times preclude the cycle stealing approach to refresh, since the decoding time required to determine that an internal operation is being performed may not leave sufficient time in the cycle to accomplish refresh, forcing a wait state at the end of refresh. Accordingly, the effectiveness of the cycle stealing technique is reduced in high speed microprocessor systems.

In addition, as the number of potential bus masters increases, such as in communication systems, the complexity of the circuitry required for implementing refresh according to the cycle stealing technique also increases, and becomes more cumbersome. The efficiency of this technique is therefore also reduced in complex systems constructed according to bus architectures. The cycle stealing operation becomes even more cumbersome when the number of bus masters necessitates bus splitting, especially where the bus masters are bidirectionally connected to the bus.

It is therefore an object of the present invention to provide DRAM refresh control circuitry, and a method of refreshing DRAM memory, which minimize bus cycle interruption to accomplish refresh.

It is a further object of the present invention to provide such a method and circuitry which have a high priority mode to ensure that refresh specifications are not violated.

It is a further object of the present invention to provide such a method and circuitry which operate in a manner consistent with high speed communication systems.

Other objects and advantages of the invention will be apparent to those of ordinary skill in the art having reference to the following specification in combination with the drawings.

SUMMARY OF THE INVENTION

The invention may be incorporated into a system and method for controlling refresh operations for a DRAM memory, by way of a first counter that is periodically incremented over time and a second counter that is incremented upon completion of a refresh operation. A comparator compares the contents of the two counters, and requests bus access for refresh when the contents differ; the bus access priority for refresh is no higher than that for other bus operations, and as such the refresh request will wait until the bus is available. Upon granting of access to the bus for refresh, refresh operations are performed until the contents of the two counters again match.

In addition, a second comparator may be provided for determining if the difference between the contents of the two counters differ by a selected amount, indicating that the refresh specification period is about to expire. In this event, interrupt of any current bus cycle is effected, and bus access granted to the refresh operation until the contents of the first and second counters again match, indicating a fully refreshed state.

DETAILED DESCRIPTION OF THE PREFERRED EMBODIMENT

Figure 1:
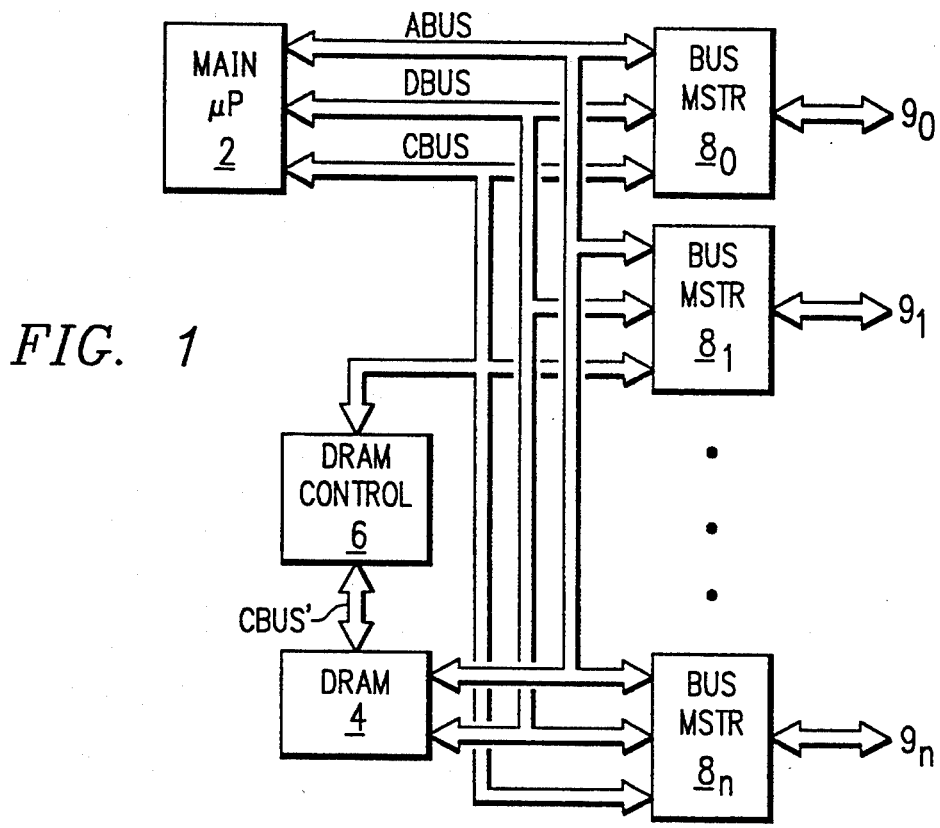
FIG. 1 is an electrical diagram, in block form, of a system incorporating the preferred embodiment of the invention.

Referring first to FIG. 1, a typical system which can especially benefit from the present invention will be described. The system of FIG. 1 corresponds to a local-area-network (LAN) controller port, but may alternatively correspond to other bus architecture data processing systems in which one of several circuits may obtain control of a common bus. Of course, the system context of FIG. 1 is not to be construed in a limiting fashion, as the present invention is also useful in data processing systems having other architectures. However, it is contemplated that the present invention is particularly useful in a bus architecture system as shown in FIG. 1.

In the system of FIG. 1, main microprocessor 2 is connected to address bus ABUS, data bus DBUS, and control bus CBUS, and serves as the host CPU for the system. Main microprocessor 2 is of conventional type, such as a MC68340 microprocessor manufactured and sold by Motorola, and controls the system in the desired manner. Address bus ABUS and data bus DBUS are connected directly to dynamic random access memory system (DRAM) 4. DRAM 4 preferably includes multiple DRAM integrated circuits arranged as one or more memory banks in the conventional manner; an example of conventional DRAM chips useful in DRAM 4 are modern 1 M×4 DRAM chips, having CAS-before-RAS refresh capability with an on-chip refresh address counter, such as the MCM514400A and MCM51L4400A CMOS Dynamic RAMs available from Motorola. Control bus CBUS is received by DRAM control circuit 6, which processes certain of the control signals in bus CBUS and controls the operation of DRAM 4 by way of local control bus CBUS'. Contained within local control bus CBUS', and generated by DRAM control circuit 6, are signals such as column address strobe CAS_, row address strobe RAS_, read/write control R/W_, output enable signal G, and other conventional DRAM control signals.

In the system of FIG. 1, multiple bus masters $8_0$ through $8_n$ are also connected to address bus ABUS, data bus DBUS, and control bus CBUS. For the example of a LAN controller, six bus masters $8_0$ through $8_5$ may be provided, each which may be of a different type and manufacturer, for receiving data from and communicating data to various other functions and systems by way of buses $9_0$ through $9_n$, respectively. Examples of bus masters $8_0$ through $8_n$ include LAN controllers available from Intel for communicating digital data according to IEEE standard 802.3 over coaxial cable, twisted pair wire, and the like, and also LAN controllers available from Motorola, such as the Motorola LAPD controller. Each of bus masters $8_0$ through $8_n$ are capable of accessing buses ABUS, DBUS, CBUS, for communicating digital data thereupon to one of the other residents of buses ABUS, DBUS, CBUS, including to other ones of bus masters $8_0$ through $8_n$, to main processor 2, and to DRAM 4. A typical communication method for bus masters $8_0$ through $8_n$ is direct memory access (DMA).

Traffic on buses ABUS, DBUS, CBUS may often be quite heavy in the system of FIG. 1, considering the multiple bus masters $8_0$ through $8_n$ together with main processor 2 and DRAM 4, especially in a communications application. In addition, since many of the transmissions in the exemplary system of FIG. 1 are accomplished by way of DMA, if periodic refresh were to be performed according to conventional techniques (where refresh has the highest bus priority), bus operations would frequently be interrupted, significantly degrading system performance.

Furthermore, as noted above, the cycle time of main processor 2 (for example the MC68340 microprocessor noted above) may be as short as 180 nsec, which will generally not provide sufficient time for both decoding the instruction and also performing a refresh operation (itself taking approximately 150 nsec) according to the cycle stealing technique. In addition, the loading on buses DBUS, ABUS, CBUS from bus masters $8_0$ through $8_n$ and main processor 2 is likely to be large, requiring that buses ABUS, DBUS, CBUS be implemented physically as split buses, with main processor 2 and DRAM 4 on one set of physical split buses, and bus masters $8_0$ through $8_n$ on the other set. Such split bus arrangements make control of cycle stealing refresh especially cumbersome and difficult.

According to the present invention, however, DRAM control circuit 4 includes refresh control circuitry 10 that monitors the number of refresh operations needed in order to place DRAM 4 in a fully refreshed state, monitors the refresh operations actually performed, and controls bus access so that DRAM refresh may be effected without interrupting an ongoing bus cycle, whenever possible. This is accomplished according to the present invention by setting the priority for refresh operations no higher than the priority for other bus operations, including DMA operations from bus masters $8_0$ through $8_n$. As a result, refresh is performed when the buses ABUS, DBUS are otherwise quiet, thus reducing the impact of the refresh operation on system performance.

Prior to discussion of the construction and operation of the portion of DRAM control circuit 6 that effects refresh according to the present invention, the determination of the frequency and type of refresh will first be discussed. As is well known, conventional DRAM circuits are guaranteed to a particular refresh time specification that includes the time period within which each memory cell must be refreshed and the number of refresh operations required to fully refresh the DRAM circuit. For example, the MCM51L4400A memory noted above has a refresh time specification of 128 msec, and requires 1024 refresh cycles (RAS_ access, RAS_ before CAS_, or hidden refresh cycles) to fully refresh the memory.

Accordingly, design of the refresh protocol requires consideration of how many refresh cycles are necessary over a given period of time. Furthermore, the designer must select the number of refresh cycles to be performed in a single refresh event (i.e., burst versus distributed refresh). Selection of the number of refresh cycles per refresh event requires a tradeoff between reducing the overhead for obtaining bus access (which favors burst refresh) versus the extent to which other operations must wait for completion of refresh (which favors distributed refresh).

For example, in this embodiment of the invention, where DRAM 4 consists of DRAM circuits having a 128 millisecond refresh period with 1024 refresh cycles required, an efficient refresh design is to perform a minimum of sixteen refresh operations in each refresh bus grant operation. The interval between refresh events is therefore a maximum of 2.0 milliseconds (16×128 msec/1024). It is conventional to provide a safety factor of on the order of two, refreshing DRAM 4 twice as often as the specification limit, to ensure high reliability data retention. In the example described hereinbelow, DRAM control circuit 4 effects seventeen refresh operations in each refresh event, optimally occurring every 983 μsec (i.e., in the case of no other bus traffic). As will be apparent from the description hereinbelow, granting bus control for refresh only as the bus becomes available will generally result in refresh not occurring at evenly spaced intervals, but still within the specified time.

Figure 2:
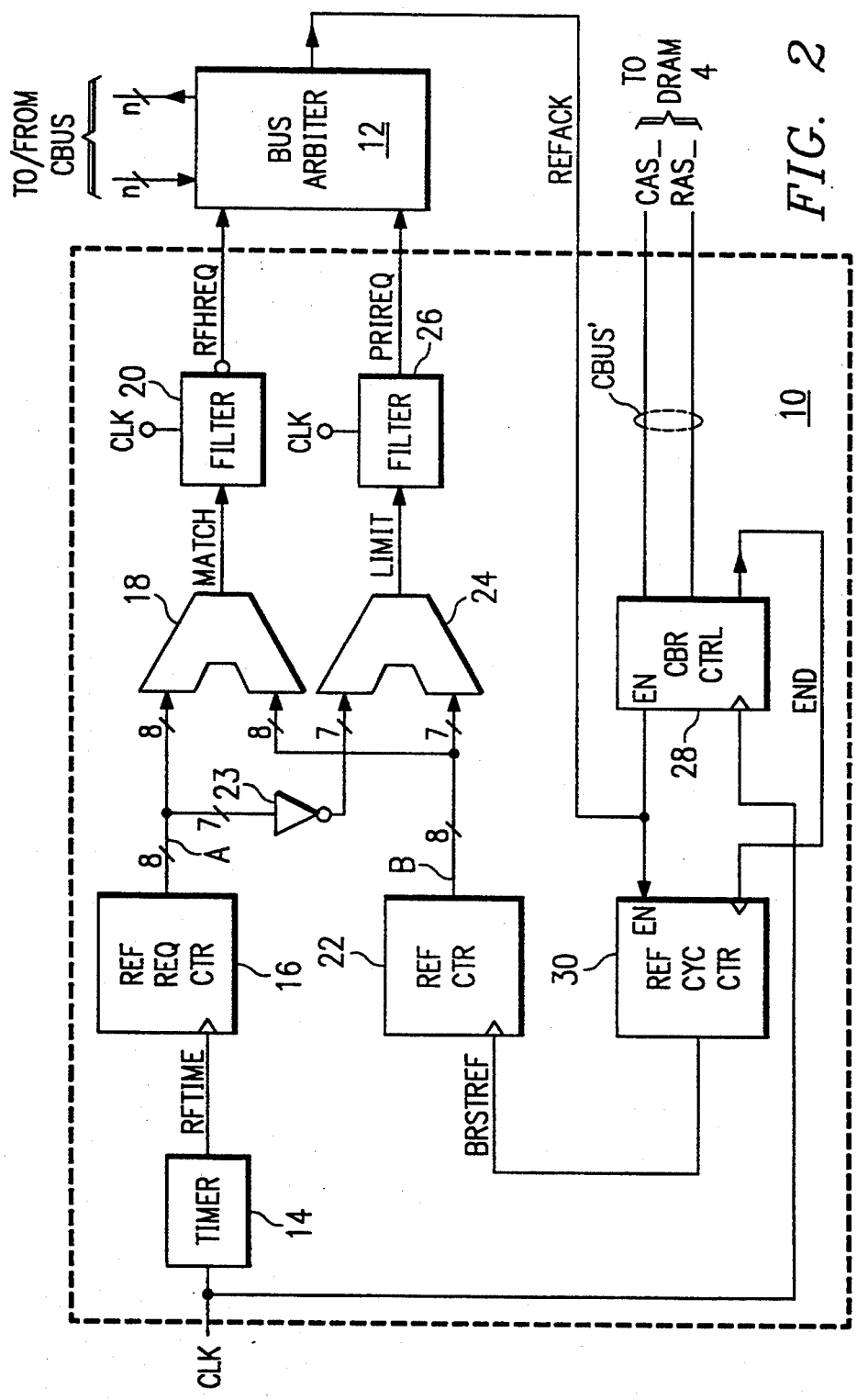
FIG. 2 is an electrical diagram, in block form, of DRAM refresh control circuitry constructed according to the preferred embodiment of the invention.

Referring now to FIG. 2, the construction and operation of the refresh control circuit 10 which, in combination with bus arbiter 12, controls the refresh of DRAM 4, will now be described in detail. In this example, refresh control circuit 10 and bus arbiter 12 are each contained within DRAM control circuit 6 in the system of FIG. 1, preferably constructed as a gate array or other custom logic. Of course, alternative implementations of the present invention may locate these functions elsewhere in the system as desired for other reasons, or may implement these functions in circuitry other than a gate array implementation.

Refresh control circuit 10 includes refresh timer 14, which receives a high frequency clock signal on line CLK at its clock input. Refresh timer 14 is a conventional timer for generating a signal on line RFTIME upon the elapse of the desired time period at which a refresh operation is to be performed (the "refresh interval"). In this embodiment, timer 14 is constructed as a conventional digital counter, such as a series of toggle-type flip-flops connected in series, with the last of the flip-flops generating a pulse at its output responsive to receipt of a selected number of cycles of the clock signal on line CLK. In this example, where the desired refresh interval is 983 μsec and the frequency of the clock signal on line CLK is approximately 16.67 MHz (i.e., a clock period of 60 nsec), timer 14 is a fourteen bit counter.

Line RFTIME at the output of timer 14 is received at a clock input of refresh request counter 16. The function of refresh request counter 16 is to count the number of refresh intervals detected by timer 14. Refresh request counter 16 provides an eight-bit output on bus A to present a digital indication of its contents.

Figure 3:
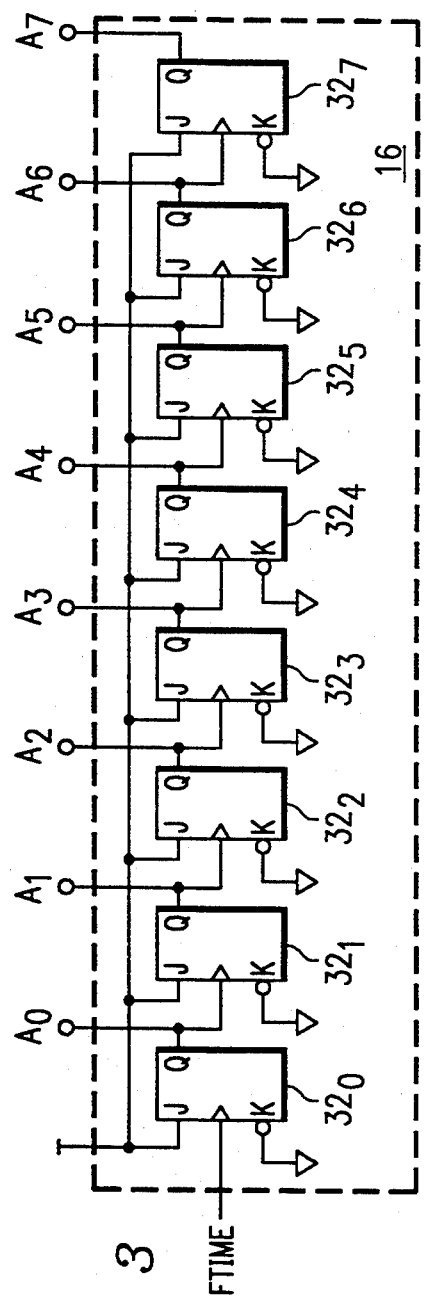
FIG. 3 is an electrical diagram, in schematic form, of one of the counters in the control circuitry according to the preferred embodiment of the invention.

Referring to FIG. 3, the construction of refresh request counter 16 will now be described. Refresh request counter 16 consists of eight J-K flip-flops $32_0$ through $32_7$ connected in series, with the Q output of each flip-flop $32_0$ through $32_6$ connected to the clock input of the next flip-flop $32_1$ through $32_7$; the clock input of flip-flop $32_0$ receives line RFTIME from timer 14. The reset inputs (not shown) of each of flip-flops 32 may receive a reset input, so that the state of counter 16 can be zeroed on power-up or any other appropriate time, as desired.

For each of flip-flops 32, the J input is biased high to $V_{cc}$ while the K_ (complement K input) is biased to ground; as such, each of flip-flops 32 are configured as T, or toggle, type flip-flops which change the state of their Q output responsive to a clock signal. Accordingly, flip-flops $32_0$ through $32_7$ provide an eight-bit binary count of the number of cycles of the signal on line RFTIME on lines $A_0$ through $A_7$, respectively.

Referring back to FIG. 2, the eight-bit output of refresh request counter 16 on bus A is coupled to a first input of eight-bit comparator 18. The second input of eight-bit comparator 18 receives the output of refresh counter 22 via bus B. Refresh counter 22 is constructed similarly as refresh request counter 16, but is responsive to refresh operations actually performed, as will be described in further detail hereinbelow. The output of comparator 18, on line MATCH, is communicated to clocked filter 20, which in turn generates a signal on line RFHREQ to bus arbiter 12.

Comparator 18 drives line MATCH to a high logic level to indicate that the two eight-bit inputs presented to comparator 18 match one another, and drives line MATCH to a low logic level to indicate that the two eight-bit inputs presented thereto differ. Filter 20 operates as a low pass filter, to ensure that glitches or noise-induced pulses on line MATCH are not presented to bus arbiter 12.

Figure 4:
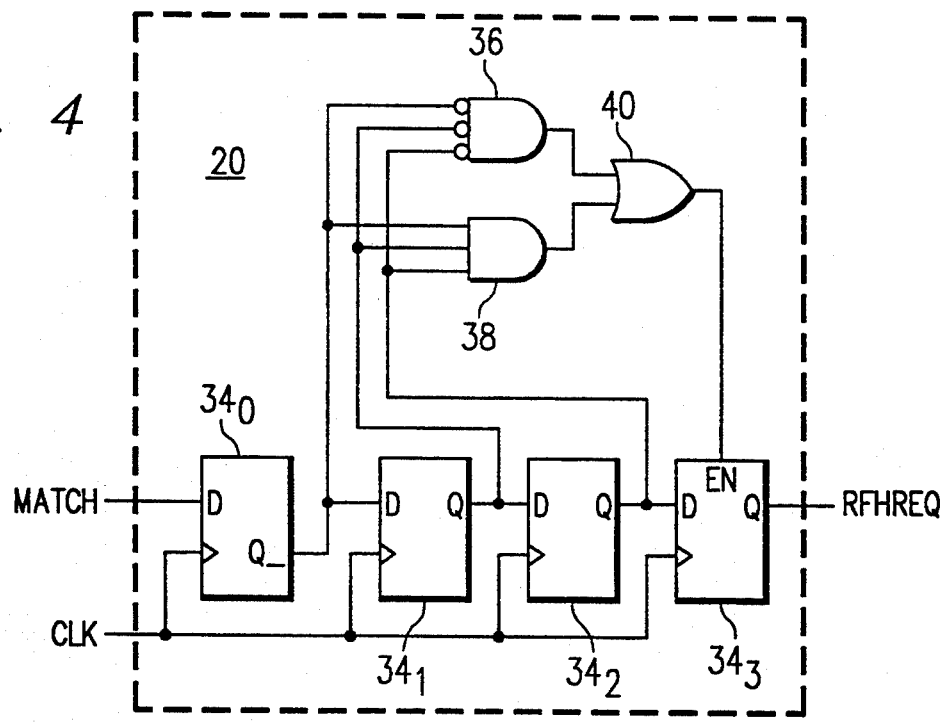
FIG. 4 is an electrical diagram, in schematic form, of one of the glitch filters in the control circuitry according to the preferred embodiment of the invention.

Referring to FIG. 4, the construction of filter 20 will now be described in detail. Filter 20 includes four D-type flip-flops $34_0$ through $34_3$, each of which receive line CLK at their clock input. The D input of flip-flop $34_0$ receives the signal on line MATCH from comparator 18, and the Q_ output of flip-flop $34_0$ is connected to the D input of flip-flop $34_1$ (as it is the low logic level on line MATCH that is to be used to generate a high logic level signal on line RFHREQ). The D inputs of flip-flops $34_2$ and $34_3$ receive the Q output of flip-flops $34_1$ and $34_2$, respectively.

Flip-flop $34_3$ drives line RFHREQ with its Q output, and also has its enable input connected to the output of OR gate 40. OR gate 40 receives the outputs of AND gates 36 and 38 at its inputs. AND gate 36 receives the complement of the Q_ output from flip-flop $34_0$ and the complement of the Q outputs from flip-flops $34_1$ and $34_2$; AND gate 38 receives the Q_ output from flip-flop $34_0$ and the Q outputs from flip-flops $34_1$ and $34_2$. Accordingly, the output of OR gate 40 is high only when the Q_ output of flip-flop $34_0$ and the Q outputs of flip-flops $34_1$ and $34_2$ match each other (either high or low), as is the case when the logic level on line MATCH has remained stable for three cycles of the clock on line CLK. Accordingly, any logic level on line MATCH that does not have a duration of at least three clock cycles will not cause a change of state on line RFHREQ. According to this embodiment of the invention, therefore, filter 20 presents a high logic level on line RFHREQ to bus arbiter 12 responsive to a low logic level on line MATCH, indicating that the inputs to comparator 18 differ and remaining low for three clock cycles.

Bus arbiter 12 is a conventional bus arbiter that receives bus request signals from multiple sources, such as bus masters 8 in FIG. 1 and from filter 20, and is for determining which of the sources is to have access to the bus according to a priority scheme and granting bus access by way of an acknowledge signal in the conventional handshaking manner. According to this embodiment of the invention, however, the priority assigned to refresh control circuitry 10 for bus requests from comparator 18, via line RFHREQ from filter 20, is no higher than any other bus master 8 or resident of the bus. As such, if line RFHREQ goes to a high level to request bus access during such time that another bus master $8_i$ has control of the bus, the bus cycle and operation of bus master $8_i$ will not be interrupted.

In this embodiment of the invention, the example of the arbitration scheme implemented in bus arbiter 12 is a "round-robin" priority scheme. As is well known in the art, a round-robin priority scheme operates according to an arbitrary circular sequence of the bus masters (including refresh control circuit 10). At such time as a bus master releases the bus, bus arbiter 12 grants bus access to the next bus master in the arbitrary sequence that has requested the bus. If no other bus master has requested the bus, the first one to do so after release of the bus will be granted access. According to the preferred embodiment of the invention, the bus request signal presented on line RFHREQ by comparator 18 via filter 20 occupies one state in the round-robin sequence, with no higher priority than other bus masters therein. That is, signal RFHREQ may be considered a normal priority bus request signal.

Referring still to FIG. 2, refresh control circuitry 10 further includes circuitry for generating the refresh control signals responsive to the bus grant signal from bus arbiter 12 on line REFACK. Line REFACK is connected to an enable input of CAS-before-RAS (CBR) refresh controller 28, and to an enable input of refresh cycle counter 30. CBR controller 28 generates the necessary signals on line CBUS' for application to DRAM 4 to effect a refresh operation. In this example, the preferred refresh operation is a CAS-before-RAS refresh operation, as refresh control circuit 10 need not store and present a refresh address in such a case; of course, refresh according to conventional RAS_ refresh cycles may alternatively be performed.

Figure 5:
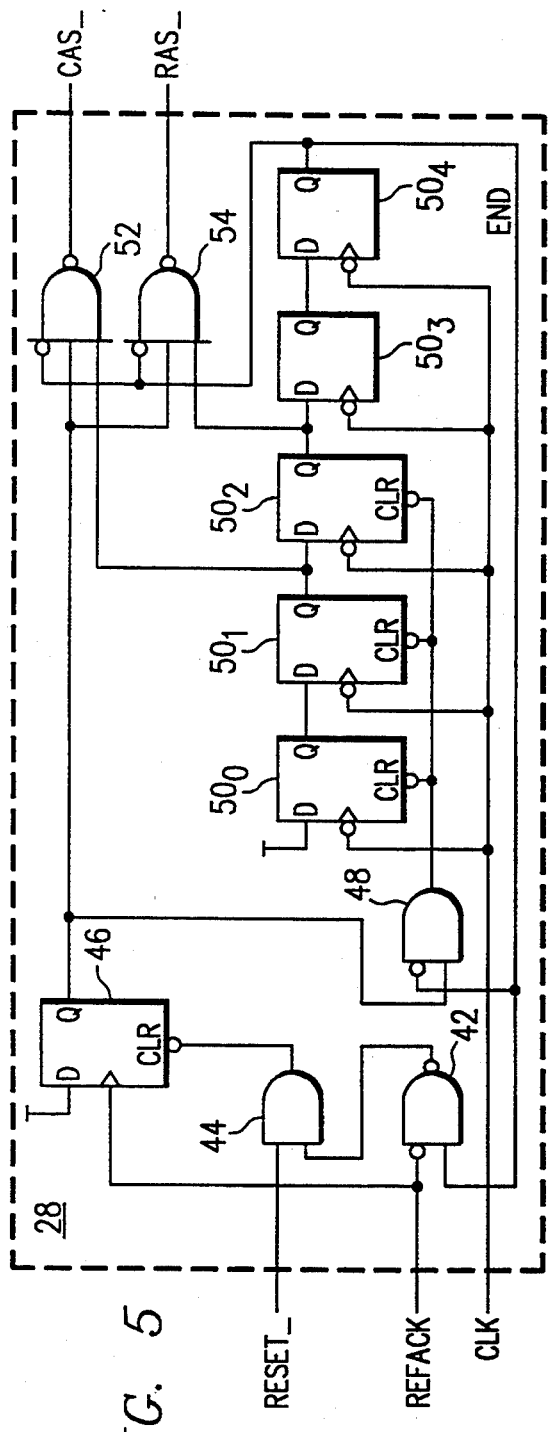
FIG. 5 is an electrical diagram, in schematic form, of the CAS-before-RAS refresh control circuit in the control circuitry according to the preferred embodiment of the invention.

Referring now to FIG. 5, the construction of CBR controller 28 will now be described in detail. CBR controller includes a series of D-type flip-flops $50_0$ connected as a shift register, each flip-flop 50 receiving line CLK at its clock input. The D input of flip-flop $50_0$ is biased to $V_{cc}$, while the D inputs of each of flip-flops $50_1$ through $50_4$ is connected to the Q output of the preceding flip-flop $50_0$ through $50_3$, respectively. The shift register consisting of flip-flops 50 serves to generate the signals on lines CAS_ and RAS_ at the appropriate times, as will be described hereinbelow. Flip-flop $50_4$ generates a signal on line END at its Q output.

CBR controller 28 further includes AND gate 48 which receives line END from the Q output of flip-flop $50_4$ at a complementary input, and which receives the Q output of D-type flip-flop 46 at another input. The output of AND gate 48 is connected to the CLR_ (complementary) inputs of each of flip-flops 50. D-type flip-flop 46 has its D input biased to $V_{cc}$, and has its clock input receiving line REFACK from bus arbiter 12. Accordingly, upon receipt of a bus grant signal on line REFACK, flip-flop 46 clocks a high level to its Q output; as will be noted hereinbelow, the Q output of flip-flop 46 enables the operation of CBR controller 28.

Line REFACK is also connected to a complementary input of NAND gate 42, which receives line END at its other input. The output of NAND gate 42 is coupled to a first input of AND gate 44, which has a RESET_ line coupled to its other input; the output of AND gate 46 is coupled to the CLR_ input of flip-flop 46.

NAND gates 52 and 54 both receive the Q output of flip-flop 46 at a first input and receive line END at a second, complementary, input. NAND gate 52 receives the Q output of flip-flop $50_1$ at its third input, and generates CAS_ at its output. NAND gate 54 receives the Q output of flip-flop $50_2$ at its third input, and generates RAS_ at its output.

In operation, the output of NAND gate 42 is low prior to a bus grant (i.e., with line REFACK low), causing AND gate 44 to present a low logic level to flip-flop 46, clearing it for the next refresh operation.

The low logic level at the Q output of flip-flop 46 forces the output of AND gate 48 low, resetting all of flip-flops 50 in the shift register and forcing line END to a low logic level.

Receipt of a high logic level on line REFACK from bus arbiter 12 causes the Q output of flip-flop to be driven high (the output of NAND gate 42 also goes high so that, assuming line RESET_ is high, flip-flop 46 cannot be reset). The high level at the Q output of flip-flop 46 is communicated to AND gate 48 which, with line END remaining low, ensures that flip-flops 50 are enabled. Furthermore, the high logic level at the Q output of flip-flop 46, together with the low logic level on line END, enables NAND gates 52, 54 to respond to flip-flops $50_1$, $50_2$, respectively.

The Q output of flip-flop $50_1$ thus is driven high upon the second pulse of the clock on line CLK after line REFACK is high; this state causes NAND gate 52 to drive its output low, issuing a low logic level on line CAS_ to DRAM 4. Upon the next cycle of the clock on line CLK (approximately 60 nsec later in this example), the Q output of flip-flop $50_2$ goes high, causing NAND gate 54 to drive its output low and issue a low logic level on line RAS_ to DRAM 4. This operation initiates a single CAS-before-RAS refresh operation in DRAM 4.

Two more cycles of the clock on line CLK after RAS· is driven low causes the Q output of flip-flop $50_4$ to be driven high, on line END. The high logic level on line forces the outputs of NAND gates 52, 54 high, ending the CAS-before-RAS refresh operation. In addition, the high logic level on line END clears flip-flops 50 (via AND gate 48) and flip-flop 46 (via NAND 42 and AND 44).

Referring back to FIG. 2, refresh cycle counter 30 has its clock input connected to line END from CBR controller 28. As such, upon completion of each single CAS-before-RAS refresh operation, the count in refresh cycle counter 30 is advanced. In this embodiment of the invention, where each burst refresh operation is to perform seventeen single CAS-before-RAS refresh cycles, refresh cycle counter 30 is a seventeen-bit counter, constructed according to conventional techniques, for generating a high logic level refresh complete signal on line BRSTREF upon receipt of seventeen pulses on line END from CBR controller 28.

Line BRSTREF is connected to the clock input of refresh counter 22, which is similarly constructed as refresh request counter 16, and which presents an eight-bit digital value at its output on bus B to comparator 18. Accordingly, refresh counter 22 is incremented upon completion of each burst refresh operation which, in this embodiment of the invention, corresponds to the completion of seventeen single CAS-before-RAS refresh operations.

Also according to this embodiment of the invention, seven-bit comparator 24 is included which receives the seven least significant bits of bus B, and which receives the seven least significant bits of bus A after inversion by inverter block 23 (consisting of seven single-bit inverters). Comparator 24 drives line LIMIT at its output to a high logic level when the two seven-bit values at its inputs match. In this embodiment of the invention, due to the operation of inverter block 23, line LIMIT goes high responsive to the contents of refresh request counter 16 and refresh counter 22 differing from one another by the value $126_{10}$. Since, in this embodiment of the invention, refresh request counter 16 is incremented every 983 μsec, line LIMIT is driven high if refresh request counter 16 has incremented 126 times more than refresh counter 22 has incremented. This event will occur, for example, if no refresh operation has been initiated for approximately 124 msec, near the 128 msec refresh specification period for DRAM 4.

The output of comparator 24 is filtered by clocked filter 26, which is similarly constructed as filter 20 described hereinabove (except that no logical inversion takes place), to generate a signal on line PRIREQ to bus arbiter 12. In this embodiment of the invention, a high logic level on line PRIREQ serves as the highest priority bus request signal to bus arbiter 12 (i.e., is outside of the round-robin sequence of the other bus requests), and will cause an interrupt of any ongoing bus cycle or operation. This operation ensures that the refresh specification is not violated due to an excessively long bus operation or bus sequence in which no refresh has been possible for nearly the full refresh specification limit.

Figure 6:
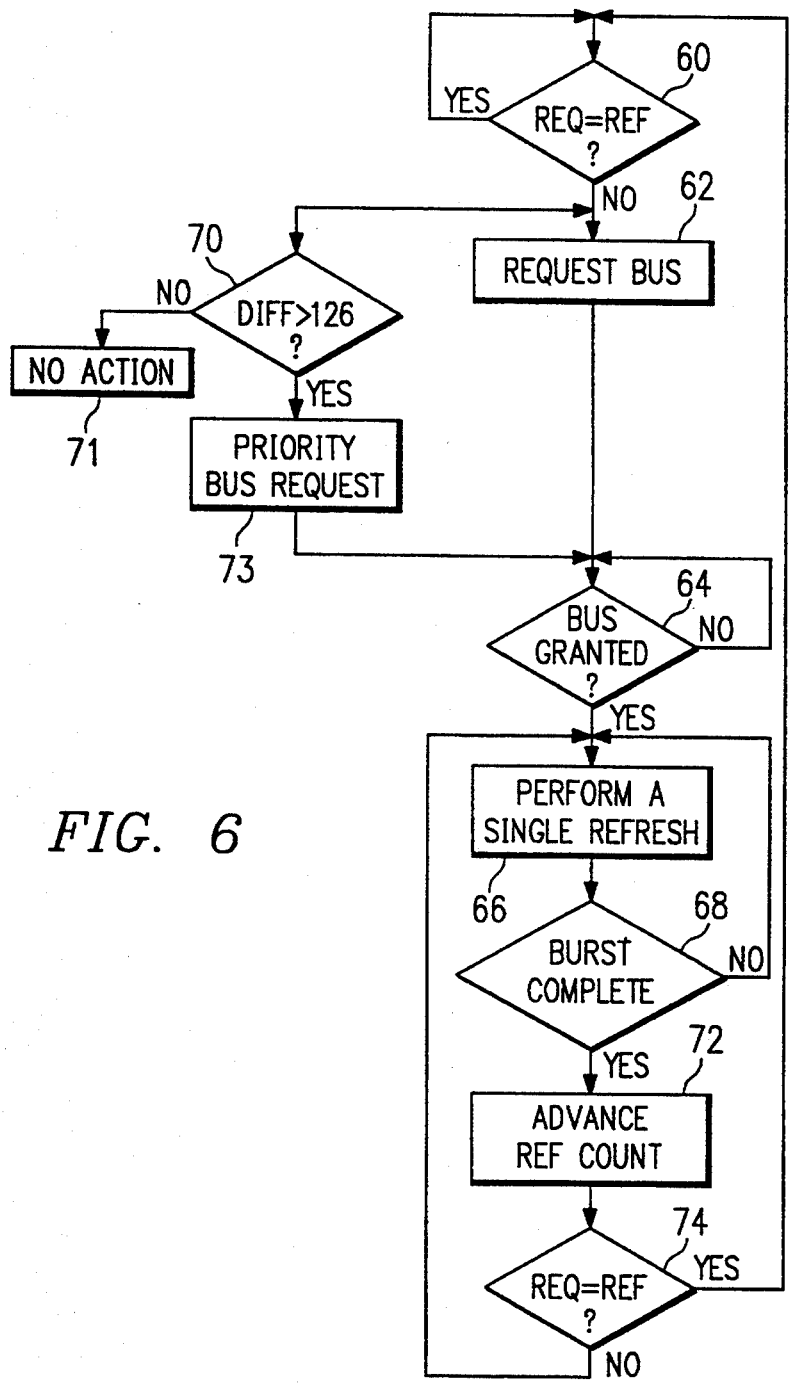
FIG. 6 is a flow chart illustrative of the operation of the control circuitry according to the preferred embodiment of the invention.

Referring now to FIG. 6 in combination with FIG. 2, the overall operation of refresh control circuit 10 according to the present invention will now be described. In operation, and throughout the operation to be described hereinbelow, the clock signals on line CLK continue on a periodic basis, for example at 16.67 MHz. Accordingly, timer 14 will continue to increment refresh request counter 16 every $2^{14}$ cycles of the clock on line CLK, or every 983 μsec. This counting and incrementing by timer 14 and counter 16 continue throughout the operation, and as such are not illustrated in the flow chart of FIG. 6.

Decision 60 is performed by comparator 18 to determine whether or not the contents of refresh request counter 16 match the contents of refresh counter 22. In the event that counters 16, 22 match one another, line MATCH stays high and line RFHREQ to bus arbiter 12 remains low; no bus request is thus made to bus arbiter 12. At such time as the contents of refresh request counter 16 and refresh counter 22 do not match, however, process 62 is performed by which a high logic level is presented on line RFHREQ to bus arbiter 12 responsive to a stable low level on line MATCH from comparator 18, indicating that the refresh request counter 16 has advanced due to the elapse of a refresh interval.

After process 62 is performed in which access to the bus is requested, refresh control circuit 10 enters a state by which it waits for the bus to be granted to it, indicated by a high level on line REFACK from bus arbiter 12. This waiting operation is illustrated in FIG. 6 by decision 64, repeated until bus access is granted. As discussed above, in this embodiment of the invention, bus priority is arbited according to a round-robin arbitration scheme, such that the request made by comparator 18 does not take a higher priority than any other bus cycle or operation, and as such does not interrupt any ongoing bus cycle.

Upon receipt of a high level on line REFACK, indicating that bus access has been granted, process 66 is performed by which a single CAS-before-RAS refresh is performed. As noted above, this operation is enabled by a high logic level on line REFACK, enabling both CBR controller 28 and refresh cycle counter 30. CBR controller 28 effects the single refresh operation in the manner described hereinabove, by activating the $CAS_{31}$ clock prior to the RAS_ clock, and terminating both thereafter. The end of each CAS-before-RAS cycle causes a pulse on line END and increments refresh cycle counter 30. CAS-before-RAS refresh operations (process 66 and decision 68 of FIG. 6) continue to be performed until, in this example, seventeen such operations have been performed. Upon completion of the seventeen cycle burst, refresh cycle counter 30 issues a pulse on line BRSTREF to refresh counter 22, advancing the contents thereof (process 72).

It is possible that completion of the first burst refresh operation causes the contents of refresh counter 22 to match the contents of refresh request counter 16, particularly if bus access was quickly granted by bus arbiter 12 to the refresh operation. Accordingly, upon completion of the first burst refresh, comparator 18 may issue a match signal, causing decision 74 of FIG. 6 to return a positive result. In this event, line MATCH will be driven high by comparator 18, line RFHREQ will be driven low to indicate to bus arbiter that the bus is released by refresh control circuit 10, and the loop of decision 60 of FIG. 6 will again be entered, awaiting the next increment of refresh request counter 16 upon timer 14 driving line RFTIME high upon elapse of the next refresh interval.

However, if the bus was busy at the time that RFHREQ was asserted by comparator 18, and remained so for some time, a single advance of refresh counter 22 (process 72) may not cause its contents to match those of refresh request counter 16. This will be the case if another pulse on line RFTIME was received during the burst operation, or if multiple pulses were received while waiting for bus access. In this event, line RFHREQ will remain high even after advance of refresh counter 22, in which case the result of decision 74 in FIG. 6 is negative, refresh control circuit 10 retains control of the bus, and the next burst refresh operation is initiated (process 66). The refresh operation is then continued until such time as the contents of refresh counter 22 catch up to the contents of refresh request counter 16.

As noted above, comparator 24 in refresh control circuit 10 is effective to cause a priority refresh in the event that the time since the last refresh operation becomes dangerously long. This operation is shown in FIG. 6 by way of decision 70, which is actually performed constantly by comparator 24, but is not effective unless the contents of refresh request counter 16 differ from the contents of refresh counter 22. As such, decision 70 is effectively operable during the time that access to the bus has been requested on line RFHREQ but has not yet been granted. During such times, if the difference in the contents of refresh request counter 16 and refresh counter 22 is less than $126_{10}$, in this example, no action is taken (process 71).

However, if bus access has been requested but not granted for so long a time that the difference in the contents of refresh request counter 16 and refresh counter 22 exceeds $126_{10}$, process 73 is initiated by which a high level is driven on line PRIREQ, requesting a high priority bus access request. As described above, bus arbiter 12 will terminate ongoing bus traffic and operations upon receipt of such a signal, and will immediately grant access to the bus to refresh control circuit 10 (i.e., decision 64 will return a positive result). Since line RFHREQ has previously been at a high level, and will remain so until the contents of refresh counter 22 catch up to the contents of refresh request counter 16, once bus access has been granted to the refresh operation, refresh will continue until DRAM 4 is fully refreshed, as indicated by a high level on line MATCH from comparator 18.

As a result of the present invention, therefore, DRAM refresh is performed in a manner which interferes as little as possible with ongoing bus traffic. Bus control requests are initiated at the desired time by the refresh controller according to the present invention, but with no higher priority than most other bus masters. As such, refresh operations will not cause bus operation interrupts during typical operation, but will instead wait their turn for bus access, initiating when the bus is available. Interruption of bus operations to perform refresh is performed only when absolutely necessary, according to the present invention, for example when the time since the last refresh is approaching the refresh specification.

As a result of the present invention, therefore, refresh is performed in a highly efficient manner, with minimal system performance degradation even for systems with a relatively large number of bus masters, and which operate at high speeds. Furthermore, the circuitry required for effecting such refresh is relatively simple in construction and operation, and is not subject to extremely tight timing specifications, as in the case of decoding circuitry for cycle stealing refresh control.

While the invention has been described herein relative to its preferred embodiment, it is of course contemplated that modifications of, and alternatives to, these embodiment, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A refresh control circuit in a data processing system for effecting refresh of dynamics random access memory therein, comprising:
    a timer circuit for detecting elapse of a refresh time interval;
    a normal priority bus request circuit for generating a normal priority bus request signal to request bus access for refreshing the dynamic random access memory, comprising:
        a request counter, having a clock input coupled to said timer circuit, for counting elapsed refresh time intervals;
        a refresh counter, having a clock input; and
        a first comparator, having inputs coupled to said request counter and said refresh counter, for comparing the contents of said request counter with the contents of said refresh counter, and for generating the normal priority bus request signal responsive to the contents of said request counter not matching the contents of said refresh counter;
    a bus arbiter, having a plurality of inputs for receiving bus request signals from a plurality of bus masters, one of said plurality of inputs coupled to said normal priority bus request circuit to receive the normal priority bus request signal therefrom, and having an output for presenting a bus grant signal to a bus master responsive to receiving a bus request signal therefrom and according to a priority scheme; and
    a refresh controller, having an enable input coupled to said output of said bus arbiter, for generating control signals to initiate a refresh operation responsive to receiving, from said bus arbiter, the bus grant signal, and for presenting a refresh end signal to the clock input of said refresh counter upon completion of the refresh operation.

2. The control circuit of claim 1, wherein said refresh controller comprises:
   a control circuit for generating said control signals, having an enable input coupled to said bus arbiter to receive the bus grant signal, and having an output for presenting a refresh cycle end signal; and
   a cycle counter having a clock input for receiving said refresh cycle end signal, and having an output for presenting said refresh complete signal indicating that a selected number of refresh cycles have been performed;
   wherein the clock input of said refresh counter is coupled to the output of said cycle counter.

3. The control circuit of claim 1, wherein said timer circuit comprises a counter, having an input for receiving a periodic clock signal, and having an output coupled to said clock input of said request counter for presenting a signal responsive to receiving a selected number of said periodic clock signals.

4. The control circuit of claim 1,
   wherein said bus arbiter presents said bus grant signal responsive to receiving said normal priority bus request signal from said normal priority bus request circuit and upon termination of another one of said bus request signals received at another input to said bus arbiter.

5. The control circuit of claim 4, further comprising:
   a second comparator having inputs coupled to said refresh and request counters, for comparing the contents of said request counter with the contents of said refresh counter and for generating a high priority bus request signal responsive to the contents of said request counter differing from the contents of said refresh counter by an amount greater than a predetermined limit.

6. The control circuit of claim 5, wherein said bus arbiter presents said bus grant signal responsive to said high priority bus request signal and prior to termination of another one of said bus request signals received at another input to said bus arbiter.

7. A data processing system, comprising:
   a memory comprising dynamic random access memory, said memory coupled to a bus;
   a plurality of bus masters coupled to said bus;
   a bus arbiter, having inputs coupled to receive bus request signals from said plurality of bus masters, and for granting bus access to one of said plurality of bus masters according to a priority scheme; and
   a refresh control circuit, comprising:
   a timer circuit for detecting elapse of a refresh time interval;
   a normal priority bus request circuit for generating a normal priority bus request signal to request bus access for the refresh control circuit, comprising:
   a request counter, having a clock input coupled to said timer circuit, for counting elapsed refresh time intervals;
   a refresh counter, having a clock input; and
   a first comparator, having inputs coupled to said request counter and said refresh counter, for comparing contents of said request counter with contents of said refresh counter and for generating the normal priority bus request signal to said bus arbiter responsive to the contents of said request counter not matching the contents of the refresh counter; and
   a refresh controller, having an enable input coupled to receive a bus grant signal from said bus arbiter indicating that said refresh control circuit has been granted bus access, said refresh controller for presenting control signals to said memory to effect a refresh operation responsive to receiving the bus grant signal, and for presenting a refresh complete signal to the clock input of said refresh counter responsive to completion of the refresh operation.

8. The system of claim 7, wherein said refresh controller comprises:
   a control circuit for generating said control signals to effect a refresh cycle, having an enable input coupled to receive said bus grant signal, and having an output for presenting a refresh cycle end signal;
   a cycle counter having a clock input for receiving said refresh cycle end signal, and having an output for presenting said refresh complete signal indicating that a selected number of refresh cycles have been performed;
   wherein the clock input of said refresh counter is coupled to the output of said cycle counter.

9. The system of claim 7, wherein the refresh control circuit further comprises;
   a second comparator having inputs coupled to said refresh counter and said request counter, for comparing the contents of said request counter with the contents of sad refresh counter and for generating a high priority bus request signal to said bus arbiter responsive to the contents of said request counter differing from the contents of said refresh counter by an amount greater than a predetermined limit;
   wherein said priority scheme grants said high priority bus request signal higher priority than the bus request signals from said plurality of bus masters.

10. The system of claim 7, wherein said priority scheme is a round-robin scheme.

11. The system of claim 7, wherein said control signals presented by said refresh controller effect a CAS-before-RAS refresh cycle.

12. A method of effecting refresh of dynamic random access memory in a bus architecture data processing system in which a plurality of circuits are operable to access a bus, comprising the steps of:
   detecting the elapse of a refresh interval;
   incrementally adjusting the contents of a request counter responsive to said detecting step;
   comparing the contents of the request counter to the content of the refresh counter;
   requesting normal bus access for refreshing the memory responsive to the contents of the request and refresh counters differing from one another;
   responsive to receiving bus access, refreshing the memory and incremental adjusting the contents of the refresh counter;
   receiving a bus grant signal;
   refreshing a location of the memory;
   responsive to an end of said step of refreshing a location of the memory, advancing the refresh counter;
   thereafter, comparing the contents of the request and refresh counters; and
   repeating said steps of refreshing a location of the memory, advancing the refresh counter and thereafter comparing the contents of the request and refresh counters until the contents of the request and refresh counters match one another.

13. The method of claim 12, further comprising:
generating a high priority bus request signal responsive to the contents of the request and refresh counters differing from one another by a predetermined limit; and
responsive to said high priority bus request signal, terminating a bus access by one of said plurality of circuits and generating a grant signal.

14. The method of claim 13, wherein said step of refreshing a location of the memory comprises:
responsive to said bus grant signal, performing a single refresh operation on said memory; and
responsive to an end of said step of performing a single refresh operation on said memory, advancing a refresh cycle counter;
wherein said step of advancing the refresh counter is performed responsive to said refresh cycle counter reaching a selected value.

* * * * *

UNITED STATES PATENT AND TRADEMARK OFFICE
CERTIFICATE OF CORRECTION

PATENT NO. : 5,418,920
DATED : May 23, 1995
INVENTOR(S) : David W. Kuddes

It is certified that error appears in the above-indentified patent and that said Letters Patent is hereby corrected as shown below:

Col. 13, line 2, delete "end", insert --complete--.

Col. 13, line 54 - line 58, indent once.

Col. 13, lines 59 - Col. 14, line 2, indent twice.

Col. 14, lines 3 - 11, indent once.

Col. 14, line 56, delete "incremental", insert --incrementally--.

Col. 14, line 57, delete ";", insert --, wherein said refreshing step comprises:--

Signed and Sealed this

Twenty-sixth Day of September, 1995

Attest:

BRUCE LEHMAN

*Attesting Officer*　　　　*Commissioner of Patents and Trademarks*